United States Patent
Qureshi et al.

(10) Patent No.: US 7,616,509 B2
(45) Date of Patent: Nov. 10, 2009

(54) DYNAMIC VOLTAGE ADJUSTMENT FOR MEMORY

(75) Inventors: Qadeer A. Qureshi, Dripping Springs, TX (US); Sushama Davar, Austin, TX (US); Thomas Jew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 257 days.

(21) Appl. No.: 11/777,635

(22) Filed: Jul. 13, 2007

(65) Prior Publication Data

US 2009/0016140 A1    Jan. 15, 2009

(51) Int. Cl.
*G11C 7/00* (2006.01)
(52) U.S. Cl. ............... 365/201; 365/226; 365/129
(58) Field of Classification Search ................. 365/201, 365/226, 129
See application file for complete search history.

(56) References Cited

U.S. PATENT DOCUMENTS

| | | | |
|---|---|---|---|
| 5,774,393 A | 6/1998 | Kuriyama | |
| 6,282,135 B1 | 8/2001 | Proebsting | |
| 6,327,224 B1 | 12/2001 | Braceras et al. | |
| 6,529,436 B1 | 3/2003 | Brown | |
| 6,643,204 B1 | 11/2003 | Agrawal | |
| 7,079,443 B2 | 7/2006 | Takita et al. | |
| 7,082,068 B2 * | 7/2006 | Im et al. ........... | 365/201 |
| 7,170,091 B2 | 1/2007 | Lunde | |
| 2005/0078508 A1 | 4/2005 | Chan et al. | |
| 2005/0128790 A1 | 6/2005 | Houston | |
| 2005/0283630 A1 | 12/2005 | Shikata | |
| 2005/0289489 A1 | 12/2005 | Kim et al. | |

OTHER PUBLICATIONS

U.S. Appl. No. 11/366,286, filed Mar. 2, 2006.
PCT/US2008/064969 International Search Report and Written Opinion mailed Aug. 21, 2008.

* cited by examiner

*Primary Examiner*—Son Dinh
*Assistant Examiner*—Nam Nguyen
(74) *Attorney, Agent, or Firm*—Robert L. King; David G. Dolezal

(57) ABSTRACT

A power supply voltage for a memory on an integrated circuit is dynamically adjusted during the operating of the memory. The operating of the memory includes powering the memory at a supply voltage. A test memory of the integrated circuit is concurrently powered while operating the memory. The test memory and the memory each include bit cells of a first bit cell configuration type. A voltage level of the supply voltage is adjusted, while operating the memory, based on the testing of the test memory. The voltage level is adjusted with external variations to assume a value that guarantees no failed operation of the memory but also accurately minimizes the supply voltage. The system and method may be implemented with any type of memory. The memory and test memory may be physically implemented either separated or interspersed on the integrated circuit.

21 Claims, 4 Drawing Sheets under which memory 14 can function. The test memory 16 is used to test memory functionality at a voltage level that is below the voltage level at which memory 14 is functioning. Test memory 16 thus functions as a canary in the sense that it functions at a voltage level that is less than what memory 14 is functioning at and provides a warning when test memory 16 is no longer functional. As a result, optimal operation of memory 14 can be dynamically monitored and supply voltage adjustments made during actual operation rather than having predetermined settings made during integrated circuit testing as described above in the Background section. Test memory 16 is stressed with test patterns known to be difficult to execute by the test circuit 26. Examples of such test patterns include a checkerboard pattern of ones and zeroes, all ones, all zeroes, and addressing patterns that are worst case. The test memory 16 is also tested at a supply voltage that is less than the supply voltage provided to memory 14. In one form, the reduction in voltage of the supply voltage provided to memory 16 compared to the supply voltage provided to memory 14 is a voltage value of $V_{drop}$. In one form, $V_{drop}$ is a voltage value that is approximately within a range of five to ten percent of $V_{DD1}$.

DYNAMIC VOLTAGE ADJUSTMENT FOR MEMORY

BACKGROUND

1. Field

This disclosure relates generally to semiconductor integrated circuits, and more specifically, to power conservation for semiconductor integrated circuits.

2. Related Art

Generally, it is desirable for an integrated circuit to operate with the lowest possible power consumption. One way to reduce power consumption is to lower the power supply voltage to the integrated circuit. A known technique for achieving power reduction is to test an integrated circuit having a processor and determine the utilization level of the processor. As the processor's utilization factor decreases, the operating frequency of the processor is reduced. Also, the amount of voltage supplied to the processor is reduced a predetermined amount that permits the processor to operate in a more efficient manner.

Another known technique for achieving power reduction is to test an integrated circuit in a test environment which induces temperature variation and measures performance for the specific integrated circuit. A power supply voltage value is then selected and programmed into the integrated circuit based upon the measured test results. The value of the power supply voltage that is determined during the test mode remains constant after the integrated circuit has been tested and thus must be selected sufficiently high to meet all operating environments that the integrated circuit has been specified to be functional.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

Illustrated in FIG. 1 in block diagram form is an integrated circuit having memory with dynamic voltage adjustment in accordance with one form of the present invention;

Figure 1:
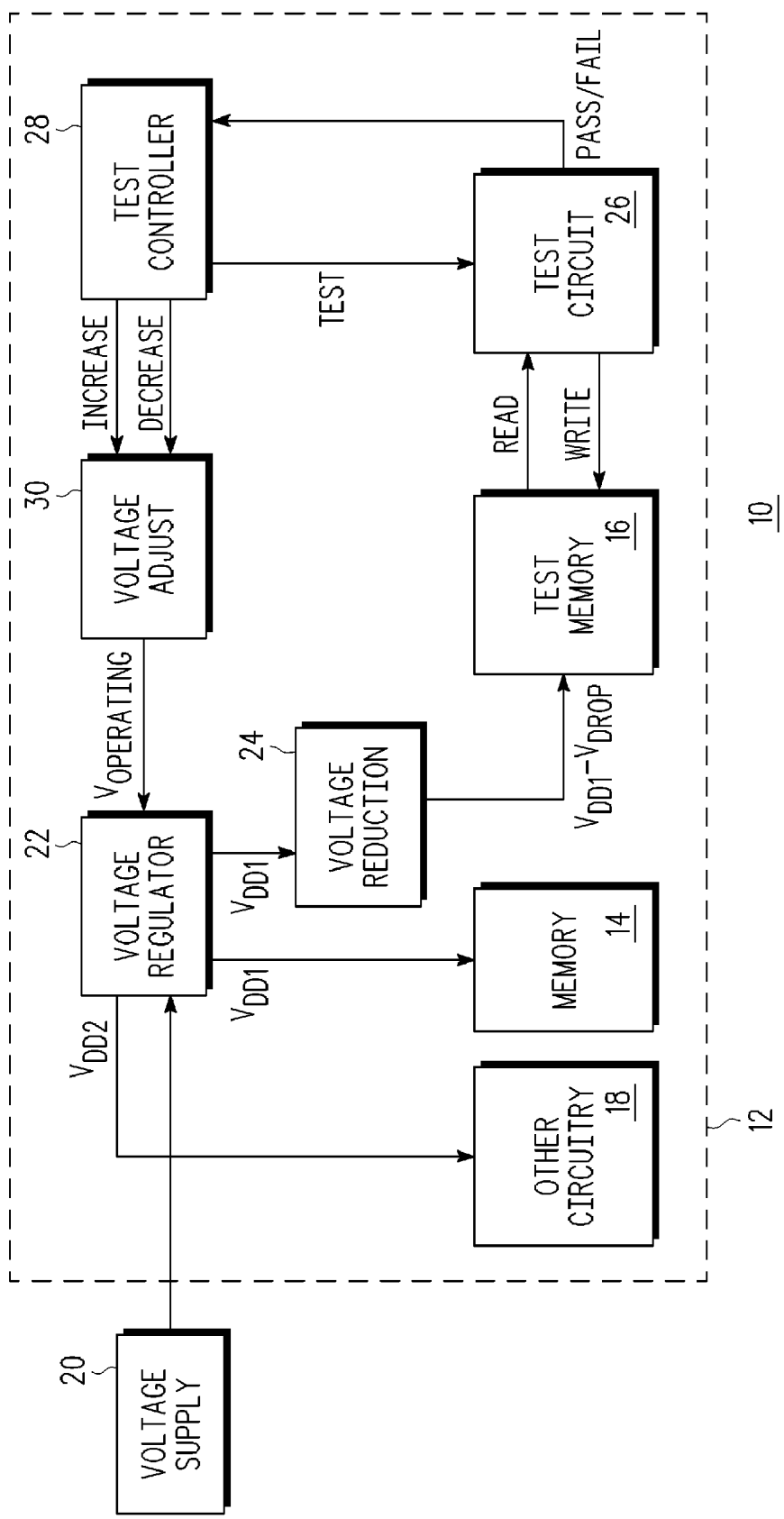
Figure 2:
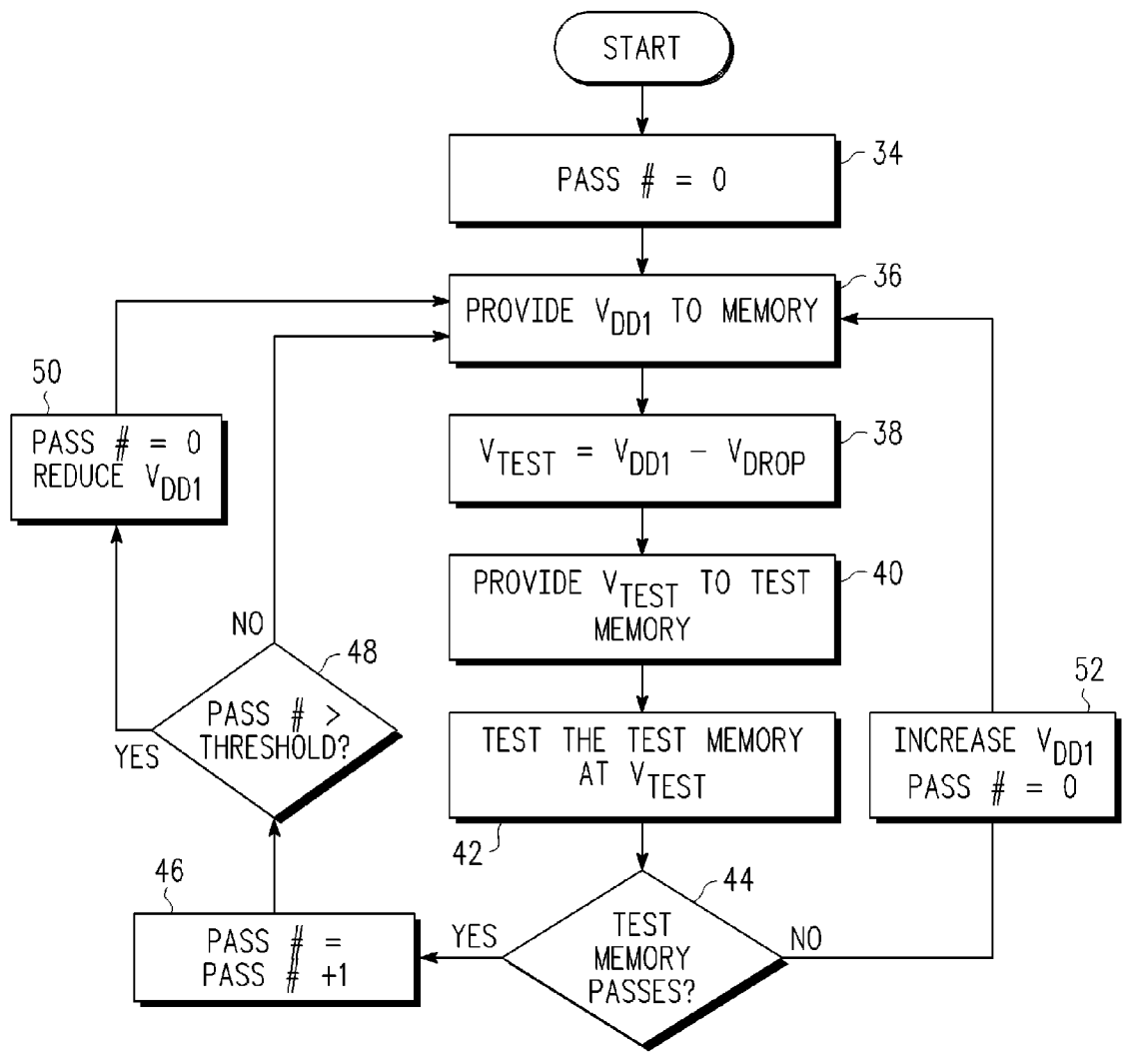
Figure 3:
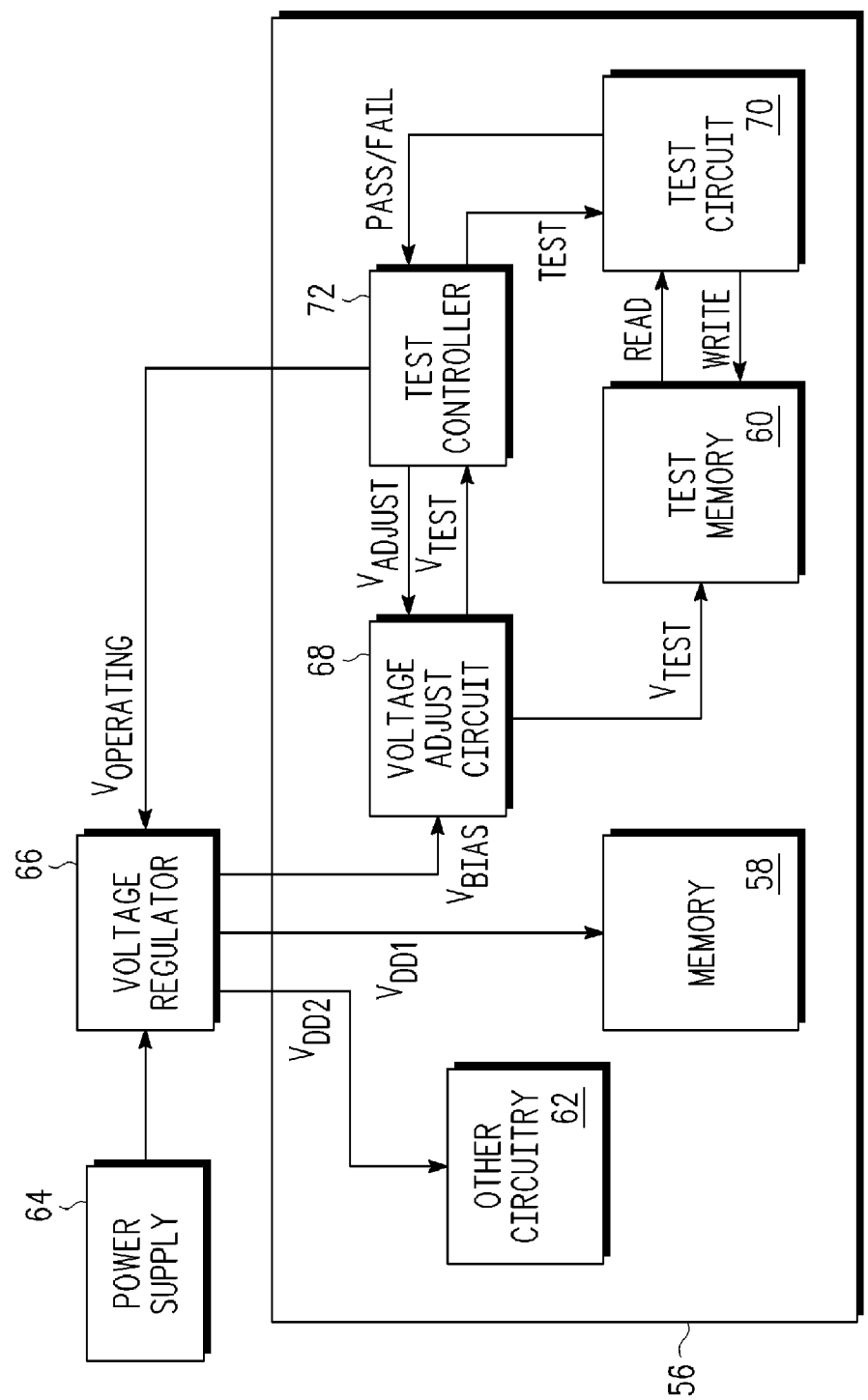
Figure 4:
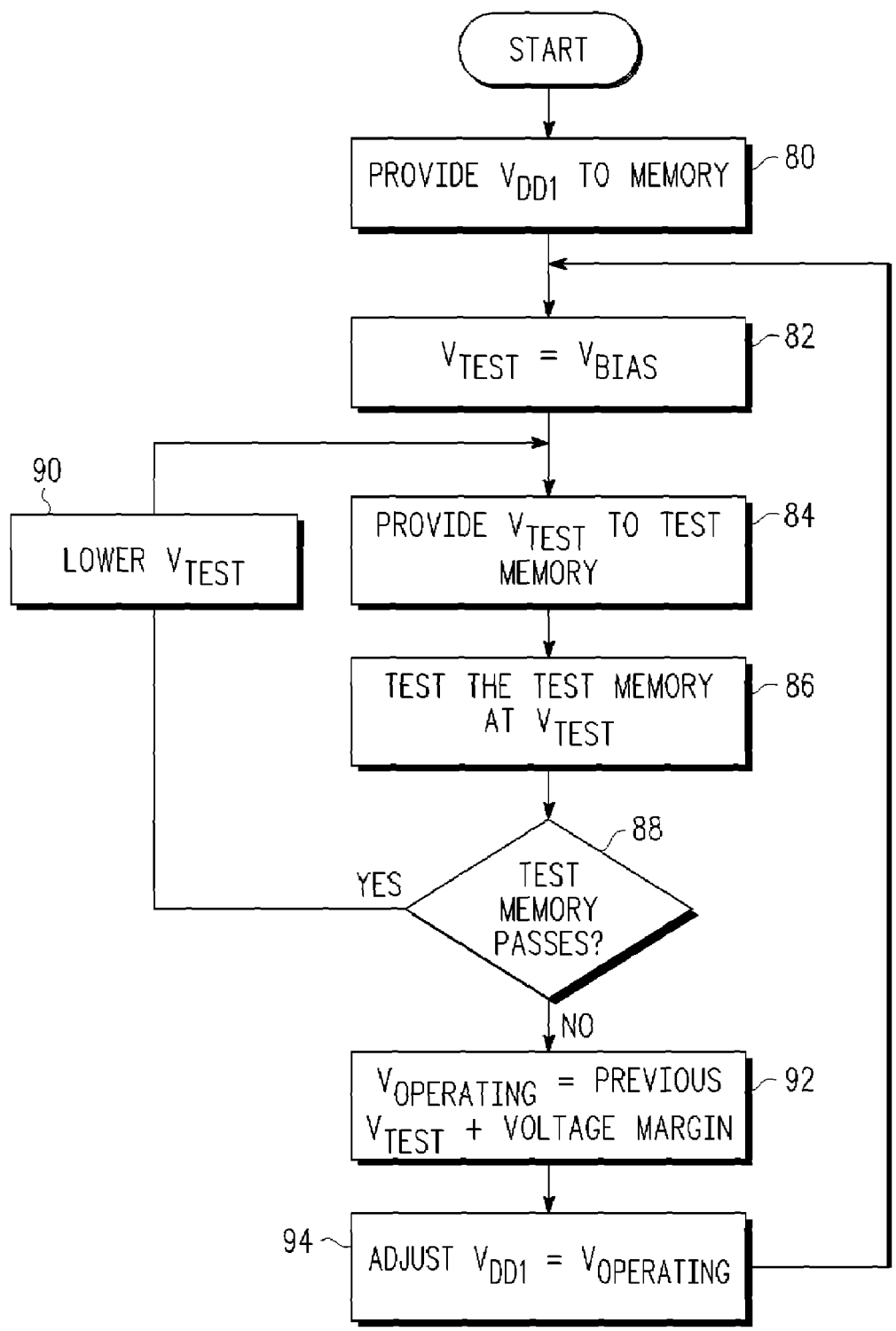

Illustrated in FIG. 2 is a flow chart of one form of the operation of the integrated circuit of FIG. 1;

Illustrated in FIG. 3 in a block diagram is an integrated circuit having memory with dynamic voltage adjustment in accordance with another form of the present invention; and Illustrated in FIG. 4 is a flow chart of one form of the operation of the integrated circuit of FIG. 3.

DETAILED DESCRIPTION

Illustrated in FIG. 1 is a system 10 that implements one form of a dynamic voltage adjustment circuit for a memory within system 10. In the illustrated form system 10 is an integrated circuit 12. External to the integrated circuit 12 is a voltage supply 20 for providing a supply voltage. System 10 has a memory 14 which may be either a volatile memory or a nonvolatile memory (NVM). It should be understood that the memory 14 further includes decode circuitry, sense amplifiers and other conventional circuitry which are not shown for convenience of explanation. A test memory 16 is also provided on the integrated circuit 12. The test memory 16 is the same type of memory device as the memory 14. Integrated circuit 12 also has other circuitry 18 which represents any of a variety of additional logic and processing circuitry. The interconnections between the other circuitry 18 and memory 14 are shown in detail and are not relevant to the discussion. It should be understood that the test memory 16 and the memory 14 may be physically located in different parts of the integrated circuit 12, adjacent to each other in the integrated circuit 12 or have memory cells that are interspersed. Voltage supply 20 is connected to an input of a voltage regulator 22. While voltage regulator 22 is illustrated as being a part of the integrated circuit 12, it should be understood that voltage regulator 22 may be implemented external to integrated circuit 12. Voltage regulator 22 has a first output connected to a voltage input of memory 14 for providing a first supply voltage labeled $V_{DD1}$. Voltage regulator 22 has a second output connected to a voltage input of the other circuit 18 for providing a second supply voltage labeled $V_{DD2}$. The first supply voltage can be lower, equal to, or higher than the second supply voltage for operating the memory 14 at a more power efficient level while satisfying other operating characteristics of a specified memory specification. Voltage regulator 22 has a third output connected to a voltage input of a voltage reduction circuit 24 for providing the $V_{DD1}$ supply voltage. An output of voltage reduction circuit 24 is connected to a voltage input of the test memory 16 and provides a voltage labeled "$V_{DD1}-V_{drop}$". The value of $V_{drop}$ is determined during design for a particular integrated circuit and a particular application. The value $V_{drop}$ represents a voltage gradation between the value $V_{DD1}$ and a reduced supply voltage used to test the test memory 16 for functional operation. The test memory 16 has an output for providing Read data for a read input of a test circuit 26. The test memory has a data input for receiving Write data from a write output of the test circuit 26. Control information provided by the test circuit 26 to the test memory 16 is coupled via control signals (not shown) in a conventional manner. An output of the test circuit 26 provides a Pass/Fail signal to an input of a test controller 28. The test controller 28 has a first output connected to an enable input of the test circuit 26 for providing a Test signal. A first output of the test controller 28 provides a first control signal labeled "Increase" and a second control signal labeled "Decrease" to first and second inputs of a voltage adjust circuit 30, respectively. An output of the voltage adjust circuit 30 provides a $V_{operating}$ signal to a control input of the voltage regulator 22.

In operation, the integrated circuit has a test memory 16 that is added to dynamically determine an optimum minimum supply voltage to be provided to the memory 14. The optimum minimum supply voltage for memory 14 is a supply voltage value which permits memory 14 to reliably be read and written at the specified (i.e. intended) frequency while consuming the minimal power required to implement memory operation without errors. In the illustrated form, the test memory 16 receives a supply voltage that is less than the memory 14. The test memory 16 is a same form of memory circuitry as the memory 14 (i.e. same process and same bit cell configuration) and is present on the integrated circuit 12 for the purpose of testing its functional operation in response to differing values of power supply voltage. A determination is made by the test circuit 26 under control of the test controller 28 and the voltage adjust circuit 30 whether the supply voltage $V_{DD1}$ which is powering memory 14 is set at its optimal value. A clock frequency is selected for operating the memory 14 and test memory 16 and that frequency of operation is maintained. In other words, the clock circuitry within integrated circuit 12 is powered by the $V_{DD2}$ power supply voltage and that power supply voltage is not modified by test circuit 26, test controller 28 and voltage adjust circuit 30. The test circuit 26, test controller 28 and voltage adjust circuit 30 function in combination to determine an optimum low value for the power supply voltage $V_{DD1}$ so that the memory 14 of system 10 operates in a power-efficient and reliable way. In particular, the voltage reduction circuit 24 functions to supply a lower supply voltage to the test memory 16 than is supplied to the memory 14. The test circuit 26 functions to write predetermined data to the test memory 16 and to read that data. Test circuit 26 functions as a comparator to compare the data that was written with what is read. If the data values exactly match, a pass signal is provided to the test controller 28. When the test results in a pass, the test controller 28 provides a Decrease control signal to the voltage adjust circuit 30 indicating that the supply voltage can be further lowered since test memory 16 is fully operational without errors. In addition, the test controller 28 implements and tracks a count value that represents a number of test iterations or passes that are made with the same supply voltage without errors before lowering the supply voltage. The test controller 28 has a predetermined threshold value for the number of test iterations to test the test memory 16. This number may be user programmable or can be predetermined and non-alterable. If the threshold number has not been exceeded, the test controller 28 generates the Test signal to the test circuit 26. In response to the Test signal, the test circuit 26 again writes a known data value to the test memory 16 and reads that value to determine if the same data is written and read. In an alternative form, the test circuit 26 may only read a previously written data value and compare the read value with an expected value for determining if any errors exist. After the threshold number for the count value is exceeded with no errors encountered, the test controller 28 indicates to the voltage adjust circuit 30 that the supply voltage may be further decreased. The voltage adjust circuit 30 provides the $V_{operating}$ control signal to the voltage regulator 22. In response, the voltage regulator 22 reduces the value of $V_{DD1}$ to the $V_{operating}$ voltage as determined by the voltage adjust circuit 30. The voltage reduction circuit 24 then provides a further reduced voltage which is a $V_{drop}$ less than the just-reduced $V_{DD1}$ voltage.

In the alternative, if the test circuit 26 indicates a fail condition, regardless of the count value, the test controller 28 will generate the Increase control signal. In response, the voltage adjust circuit 30 provides the $V_{operating}$ signal in a form that indicates to the voltage regulator 22 that the value of $V_{DD1}$ needs to be raised. Thus the memory 14 is powered by a supply voltage value that is at least two increments of the gradations of the voltage regulator 22 greater than a voltage that has been determined to begin to experience operational failures.

Illustrated in FIG. 2 is a flowchart of a method 32 of operation of the dynamic voltage adjustment within the integrated circuit 12. After a Start command or signal, in a step 34 a count value labeled "Pass #" is set to zero. The word "pass" refers to the number of iterations or passes of the described method which will be made before any reduction in the supply voltage will be made. In a step 36 a voltage value of supply voltage $V_{DD1}$ is provided to the memory 14. In a step 38 a value for a test voltage, $V_{test}$, is determined. The test voltage is equal to the supply voltage $V_{DD1}$ minus a predetermined drop amount labeled $V_{DROP}$. In a step 40 the calculated test voltage is provided to the test memory 16. In a step 42 the test memory 16 is tested for functional operation at the supply voltage value of $V_{test}$. In a step 44 a determination is made whether the test memory 16 has passed (i.e. whether correct data values were read from the test memory 16). If the test memory 16 passes, the pass number is incremented by one in a step 46. In a step 48 the pass number is checked to determine whether it is greater than a predetermined threshold value. If the incremented pass number has exceeded the threshold value, the pass number is reset back to zero and the $V_{DD1}$ supply voltage is reduced in a step 50. At this point step 36 is repeated and the new value of the $V_{DD1}$ supply voltage is provided to the memory 14. If the incremented pass number has not exceeded the threshold value, the pass number is not reset to zero and the processing goes back to step 36 where the existing value of $V_{DD1}$ continues to be provided to memory 14.

If, in contrast, at step 44 the test memory 16 did not pass as a result of providing a data value that was incorrect bit-wise from the expected data value being addressed by the test circuit 26, a step 52 is performed. In step 52 the value of the supply voltage VDD1 provided to the memory 14 and to the test memory 16 is increased by a predetermined incremental amount. Step 36 is then repeated and processing continues sequentially as shown in FIG. 2. It should be understood that once the start operation begins, the method 32 continues sequentially from step 36 through step 44 until power is removed from the integrated circuit 12.

Illustrated in FIG. 3 is a system 54 that is another form of a dynamic voltage adjustment for a memory 58 within an integrated circuit 56. The integrated circuit 56 has a test memory 60 and other circuitry 62. The memory 58 is powered by a supply voltage $V_{DD1}$ and the other circuitry is powered by a supply voltage VDD2. The supply voltage $V_{DD1}$ is different from supply voltage $V_{DD2}$. In one form the supply voltage $V_{DD1}$ is less than supply voltage $V_{DD2}$ in order to save power. Voltage regulator 66 provides a fixed bias voltage, $V_{Bias}$, to a voltage adjust circuit 68. A first output of the voltage adjust circuit 68 is connected to a power supply terminal or node of the test memory 60 for providing a test power supply voltage labeled $V_{test}$. A second output of the voltage adjust circuit 68 provides the $V_{test}$ voltage and is connected to a first input of a test controller 72. A data input of test memory 60 is connected to an output of a test circuit 70 for providing Write data. A data output of test memory 60 is connected to an input of the test circuit 70 for providing Read data. The test circuit 70 provides a Pass/Fail result signal to a second input of the test controller 72. A first output of the test control 72 is connected to an input of the test circuit 70 for providing a Test enable signal. A second output of the test controller 72 is connected to a second input of the voltage adjust circuit 68 for providing a control signal labeled $V_{Adjust}$. A third output of the test controller 72 is connected to a second input of the voltage regulator 66 for providing a voltage control signal labeled $V_{Operating}$.

In operation, the integrated circuit 56 has a test memory 60 that is present for dynamically determining an optimum minimum supply voltage to be provided to the memory 58. The optimum minimum supply voltage for memory 58 is a supply voltage value which permits memory 58 to reliably be read and written at the specified (i.e. intended) frequency while consuming the minimal power required to implement memory operation without errors. In the illustrated form, the test memory 60 initially receives a supply voltage that is equal to a bias voltage $V_{Bias}$. A determination is made by the test circuit 70 under control of the test controller 72 and the voltage adjust circuit 68. It should again be understood that a clock frequency is selected for operating the memory 58 and test memory 60 and that frequency of operation is maintained. In other words, the clock circuitry within integrated circuit 56 is powered by the $V_{DD2}$ power supply voltage and that power supply voltage is not modified by test circuit 70, test controller 72 and voltage adjust circuit 68. The test circuit 70, test controller 72 and voltage adjust circuit 68 function in combination to determine an optimum low value for the power supply voltage $V_{DD1}$ so that the memory 58 of system 54 operates in a power-efficient and reliable way. In particular, the voltage adjust circuit 68 functions to supply a test voltage to the test memory 16 that is initially at a $V_{Bias}$ value. The test circuit 70 functions to write predetermined data to the test memory 60 and to read that data. Test circuit 70 functions as a comparator to compare the data that was written with what is read. If the data values exactly match, a pass signal is provided to the test controller 72. When this memory test results in a pass, the test controller 72 provides a $V_{Adjust}$ control signal to the voltage adjust circuit 68 indicating that the supply voltage can be further lowered since test memory 60 is fully operational without errors. In addition, the test controller 72 subsequently provides a Test enable signal to the test circuit 70. In response to the Test signal, the test circuit 70 again writes a known data value to the test memory 60 and reads that value to determine if the same data is written and read. In an alternative form, the test circuit 70 may only read a previously written data value and compare the read value with an expected value for determining if any errors exist. This method is repeated until the test circuit 70 determines that a failure of the test memory 60 operation has occurred. Test circuit 70 then generates a Fail signal to the test controller 72. In response the test controller 72 provides a $V_{operating}$ signal to the voltage regulator 66. The $V_{operating}$ signal is a sum of the value of the previous test voltage (i.e. the test voltage in which no failure of operation had occurred) and a predetermined additional amount of voltage known as a voltage margin. In response to the $V_{operating}$ signal, the voltage regulator adjusts the value of $V_{DD1}$ to the memory 58 to be equal to the voltage $V_{operating}$.

Illustrated in FIG. 4 is a flowchart that describes a method 78 of operation of the dynamic voltage adjustment within the integrated circuit 56. After a Start signal or command or an enable signal, a step 80 is implemented in which a supply voltage $V_{DD1}$ is provided to memory 58 to operate memory 58. The $V_{DD1}$ supply voltage has a sufficiently high supply voltage value to ensure reliable operation of the memory 58. In a step 82 a test voltage, $V_{Test}$, is supplied by the voltage adjust circuit 68. The value of the $V_{Test}$ voltage is equal to the voltage of the fixed bias voltage, $V_{Bias}$, provided by the voltage regulator 66. In a step 84 the voltage adjust circuit 68 provides the supply voltage $V_{Test}$ to the test memory 60. In a step 86 the test memory 60 is then tested by the test circuit 70 at the supply voltage value of $V_{Test}$. In a step 88 a determination is made by the test circuit 70 whether the test memory 60 has correctly functioned in a write and a read operation. If the test memory 60 has correctly functioned, the test supply voltage $V_{Test}$ is lowered by a gradated amount in a step 90. With the lowered $V_{Test}$ voltage, steps 84-86 are repeated. If the test memory 60 continues to pass a write and read operation with the lowered $V_{Test}$, the $V_{Test}$ is again lowered, steps 84-86 are repeated and so on until the test memory 60 fails at a lowered $V_{Test}$ supply voltage value. In response to the test memory 60 failing, the operating voltage signal, $V_{operating}$, is placed at a value by the test controller 72 to be equal to the $V_{Test}$ value that was used prior to the failure of the test memory 60 and is further increased by a predetermined voltage margin. Thus a safety margin is added in. In a step 94, the supply voltage $V_{DD1}$ is adjusted upward by making $V_{DD1}$ equal to the newly determined value of $V_{operating}$. After step 94 is completed, the method 78 continues until power is removed from the integrated circuit 56. In particular, a return to the beginning of step 82 occurs and the $V_{Test}$ supply voltage is again provided to the test memory 60 as the known value Of $V_{Bias}$.

By now it should be appreciated that there has been provided various forms of a dynamic voltage adjustment circuit for adjusting supply voltage of a memory in an integrated circuit. The memory may be implemented as either a "stand-alone" type of memory or as an embedded memory in an integrated circuit with other types of circuit functions commonly referred to as a System On Chip (SOC). In an SOC that has static random access memory (SRAM) and various modules of logic circuitry, it is common for the SRAM bit cells to start failing before the logic circuitry when supply voltage is reduced for power conservation. Additionally, memory operation reliability is not easily predictable as supply voltage varies. Therefore, the memory typically determines the minimum supply voltage that is required. In the embodiments described herein, an optimal supply voltage for the memory is determined so that bifurcation between a memory power supply values and logic circuitry power supply values is implemented. Additionally, the method described herein permits a dynamic variation so that variations in temperature and other operating conditions are readily accounted for. The dynamic adjustment occurs while the memory of the integrated circuit is fully functional and thus no interruption in the operation and functionality of the memory occurs. The dynamic adjustment thus occurs when operating a memory implemented in an integrated circuit and that includes adjusting the supply voltage when the memory is storing or holding data as well as during read and write modes of operation. The test memory 16 and the test memory 60 are implemented with any of varying sizes. A large enough number of memory bit cells in the test memory is desired to ensure that the test memory represents a wide distribution of bit-cell behavior.

Because the various apparatus implementing the present invention are, for the most part, composed of electronic components and circuits known to those skilled in the art, circuit details have not been explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary memory system architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated memory circuits are SRAM. In other forms the illustrated memory circuits are implemented as DRAM, MRAM, ferroelectric memories and nonvolatile memories (NVMs) including Flash memory, and volatile storage media including registers, buffers or caches, main memory.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

The computer readable media may include, for example and without limitation, any number of the following: magnetic storage media including disk and tape storage media; optical storage media such as compact disk media (e.g., CD-ROM, CD-R, etc.) and digital video disk storage media; non-volatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

In one embodiment, system 10 is implemented in a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

In one form there is herein provided a method of powering a memory. A memory of an integrated circuit is operated by powering the memory at a supply voltage. A test memory of the integrated circuit is tested concurrently while operating the memory. The test memory and the memory each include bit cells of a first bit cell configuration type. A voltage level of the supply voltage is adjusted, while operating the memory, based on the testing the test memory. In one form the testing includes determining a minimum voltage level for powering the test memory in which the test memory passes testing. The adjusting includes providing the supply voltage at a voltage level based on the determining a minimum voltage level. In another form the test memory is tested while powering the test memory at a plurality of voltage levels. A highest voltage level of the plurality of voltage levels that the test memory fails testing is determined. In one form the supply voltage is adjusted to a voltage level that is higher than the highest voltage level. In another form the test memory is powered at a voltage level that is less than the voltage level of the supply voltage by a predetermined amount. During the powering the test memory at a plurality of voltage levels, the memory is powered at a plurality of voltage levels. In another form the testing includes writing a data pattern to the test memory, reading a data unit from the test memory, and comparing the data pattern with the data unit.

In yet another form there is herein provided a method of powering a memory by powering a memory of an integrated circuit at an operating voltage level. A test memory of the integrated circuit is tested for a first time. The operating voltage level is adjusted to a first adjusted operating voltage level based on the testing for the first time. The memory is powered at the first adjusted operating voltage level after the adjusting for a first time. The test memory is tested for a second time. The first adjusted operating voltage level is adjusted to a second adjusted operating voltage level based on the testing for a second time. The memory is powered at the second adjusted operating voltage level after the adjusting the first operating voltage level. In another form the testing for a first time includes powering the test memory at a first test voltage level based on the operating voltage level. The testing for a second time includes powering the test memory at a second test voltage level based on the first adjusted operating voltage level. In another form the first test voltage level is a predetermined amount less than the operating voltage level. The second test voltage level is the predetermined amount less than the first adjusted operating voltage level. In yet another form if the testing for the first time indicates failure, the adjusting for the first time includes increasing the operating voltage level to the first adjusted operating voltage, where the first adjusted operating voltage level is greater than the operating voltage level. In another form if the testing for the first time does not indicate failure, the adjusting for the first time includes decreasing the operating voltage level to the first adjusted operating voltage, where the first adjusted operating voltage level is less than the operating voltage level. In yet another form the testing for a first time includes testing the test memory while powering the test memory at a plurality of voltage levels and determining a first lowest voltage level of the plurality of voltage levels that the testing indicates passing, wherein the first adjusted voltage level is based on the first lowest voltage level. The testing for the second time includes testing the test memory while powering the test memory at a plurality of voltage levels and determining a second lowest voltage level of the plurality of voltage levels that the testing indicates passing, wherein the second adjusted voltage level is based on the second lowest voltage level.

A system has a memory of an integrated circuit, the memory including a supply terminal for receiving an operating supply voltage. A test memory of the integrated circuit includes a test supply terminal for receiving a test supply voltage for powering the test memory, the test memory and the memory each including bit cells of a first bit cell configuration type. The test circuitry is coupled to the test memory for testing and determining performance of the test memory, the test circuitry operable for finding a lowest test supply voltage level received at the test supply terminal at which the test memory passes testing. The supply terminal of the memory is configured to receive the operating supply voltage that is adjustable during memory operation based on performance of the test memory as determined by the test circuitry. In one form the supply terminal of the memory is configured to receive the operating supply voltage at a voltage level that is at a predetermined amount above the minimum test supply voltage level. In another form the test supply voltage is supplied at a voltage level less than a voltage level of the operating supply voltage by a predetermined amount. In yet another form the operating supply voltage is increased based on a failed test of the test memory as determined by the test circuit. In yet another form the test circuitry tests the test memory with the test supply terminal being supplied at a first test voltage level that is based on the operating supply voltage at a first voltage level. The operating supply voltage is lowered to a second voltage level based upon a determination that the test memory passes testing while being supplied at the first test voltage level. In another form the operating supply voltage is lowered to the second voltage level based upon a determination that the test memory consecutively passes a predetermined number of tests while being supplied at the first test voltage level. In yet another form the test circuitry tests the test memory with the test supply terminal being supplied at a test voltage level that is based on the operating supply voltage at a first voltage level, wherein the operating supply voltage is raised to a second voltage level based upon a determination that the test memory fails testing while being supplied at the first test voltage level. In yet another form there is provided a voltage adjustment circuit for supplying the test operating voltage at a plurality of voltage levels, wherein the test circuitry tests the test memory at levels of the plurality to determine a lowest voltage level of the plurality that the test memory passes testing, the operating supply voltage is supplied at a voltage level based on the determined lowest voltage level. In yet another form there is provided a voltage regulator including an output coupled to the operating supply terminal and an input coupled to the testing circuitry to receive an indication for adjusting the operating supply voltage based on performance of the test memory as determined by the test circuitry.

Although the invention is described herein with reference to specific embodiments, various modifications and changes can be made without departing from the scope of the present invention as set forth in the claims below. For example, many of the functions of the test circuit, test controller and voltage adjusting may be implemented in software code wherein the test circuitry would include a processing unit for executing the required code to perform the memory testing and voltage control functions. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of powering a memory comprising:
   operating a memory of an integrated circuit, the operating a memory includes powering the memory at a supply voltage;
   testing a test memory of the integrated circuit concurrently while operating the memory, the test memory and the memory each including bit cells of a first bit cell configuration type; and
   adjusting a voltage level of the supply voltage, while operating the memory, based on the testing the test memory.

2. The method of claim 1 wherein:
   the testing includes determining a minimum voltage level for powering the test memory in which the test memory passes testing; and
   the adjusting includes providing the supply voltage at a voltage level based on the determining a minimum voltage level.

3. The method of claim 1 wherein the testing the test memory includes:
   testing the test memory while powering the test memory at a plurality of voltage levels; and
   determining a highest voltage level of the plurality of voltage levels that the test memory fails testing.

4. The method of claim 3 wherein:
   the adjusting includes adjusting the supply voltage to a voltage level that is higher than the highest voltage level.

5. The method of claim 3 wherein the test memory is powered at a voltage level that is less than the voltage level of the supply voltage by a predetermined amount, wherein during the powering the test memory at a plurality of voltage levels, the memory is powered at a plurality of voltage levels.

6. The method of claim 1 wherein the testing includes:
   writing a data pattern to the test memory;
   reading a data unit from the test memory; and
   comparing the data pattern with the data unit.

7. A method of powering a memory, comprising:
   powering a memory of an integrated circuit at an operating voltage level;
   testing for a first time, a test memory of the integrated circuit;
   adjusting the operating voltage level to a first adjusted operating voltage level based on the testing for the first time;
   powering the memory at the first adjusted operating voltage level after the adjusting for a first time;
   testing for a second time, the test memory;
   adjusting the first adjusted operating voltage level to a second adjusted operating voltage level based on the testing for a second time; and
   powering the memory at the second adjusted operating voltage level after the adjusting the first adjusted operating voltage level.

8. The method of claim 7 wherein:
   the testing for a first time includes powering the test memory at a first test voltage level based on the operating voltage level; and
   the testing for a second time includes powering the test memory at a second test voltage level based on the first adjusted operating voltage level.

9. The method of claim 8 wherein:
   the first test voltage level is a predetermined amount less that the operating voltage level; and
   the second test voltage level is the predetermined amount less than the first adjusted operating voltage level.

10. The method claim 7 wherein:
    if the testing for the first time indicates failure, the adjusting for the first time includes increasing the operating voltage level to the first adjusted operating voltage, where the first adjusted operating voltage level is greater than the operating voltage level.

11. The method claim 7 wherein:
    if the testing for the first time does not indicate failure, the adjusting for the first time includes decreasing the operating voltage level to the first adjusted operating voltage, where the first adjusted operating voltage level is less than the operating voltage level.

12. The method of claim 7 wherein:

the testing for a first time includes testing the test memory while powering the test memory at a plurality of voltage levels and determining a first lowest voltage level of the plurality of voltage levels that the testing indicates passing, wherein the first adjusted operating voltage level is based on the first lowest voltage level; and the testing for the second time includes testing the test memory while powering the test memory at a plurality of voltage levels and determining a second lowest voltage level of the plurality of voltage levels that the testing indicates passing, wherein the second adjusted operating voltage level is based on the second lowest voltage level.

13. A system comprising:

a memory of an integrated circuit, the memory including a supply terminal for receiving an operating supply voltage;

a test memory of the integrated circuit, the test memory including a test supply terminal for receiving a test supply voltage for powering the test memory, the test memory and the memory each including bit cells of a first bit cell configuration type; and test circuitry coupled to the test memory for testing and determining performance of the test memory, the test circuitry operable for finding a lowest test supply voltage level received at the test supply terminal at which the test memory passes testing;

wherein the supply terminal of the memory is configured to receive the operating supply voltage that is adjustable during memory operation based on performance of the test memory as determined by the test circuitry.

14. The system of claim 13 wherein the supply terminal of the memory is configured to receive the operating supply voltage at a voltage level that is at a predetermined amount above the minimum test supply voltage level.

15. The system of claim 13 wherein the test supply voltage is supplied at a voltage level less than a voltage level of the operating supply voltage by a predetermined amount.

16. The system of claim 13 wherein the operating supply voltage is increased based on a failed test of the test memory as determined by the test circuitry.

17. The system of claim 13 wherein the test circuitry tests the test memory with the test supply terminal being supplied at a first test voltage level that is based on the operating supply voltage at a first voltage level, wherein the operating supply voltage is lowered to a second voltage level based upon a determination that the test memory passes testing while being supplied at the first test voltage level.

18. The system of claim 17 wherein the operating supply voltage is lowered to the second voltage level based upon a determination that the test memory consecutively passes a predetermined number of tests while being supplied at the first test voltage level.

19. The system of claim 13 wherein the test circuitry tests the test memory with the test supply terminal being supplied at a test voltage level that is based on the operating supply voltage at a first voltage level, wherein the operating supply voltage is raised to a second voltage level based upon a determination that the test memory fails testing while being supplied at the first test voltage level.

20. The system of claim 19 further comprising a voltage adjustment circuit for supplying the test supply voltage at a plurality of voltage levels, wherein the test circuitry tests the test memory at levels of the plurality of voltage levels to determine a lowest voltage level of the plurality of voltage levels that allows the test memory to pass testing, the operating supply voltage is supplied at a voltage level based on the lowest voltage level determined to allow the test memory to pass testing.

21. The system of claim 13 further comprising:

a voltage regulator including an output coupled to the supply terminal and an input coupled to the test circuitry to receive an indication for adjusting the operating supply voltage based on performance of the test memory as determined by the test circuitry.

* * * * *